United States Patent [19]
Katoh et al.

[11] Patent Number: 5,448,105
[45] Date of Patent: Sep. 5, 1995

[54] SEMICONDUCTOR DEVICE HAVING A LEADFRAME AND METAL SUBSTRATE

[75] Inventors: Kazunori Katoh, Tokyo; Gen Murakami, Kodaira; Hiromichi Suzuki, Kodaira; Takayuki Okinaga, Kodaira; Takashi Emata, Kodaira; Osamu Horiuchi, Kodaira, all of Japan

[73] Assignees: Dia Nippon Printing Co., Ltd.; Hitachi, Ltd.; Hitachi VLSI Engineering Corp., all of Tokyo, Japan

[21] Appl. No.: 372,901

[22] Filed: Jan. 17, 1995

Related U.S. Application Data

[63] Continuation of Ser. No. 976,708, Nov. 16, 1992, abandoned, which is a continuation of Ser. No. 588,903, Sep. 27, 1990, abandoned.

[30] Foreign Application Priority Data

Sep. 28, 1989 [JP] Japan .................. 1-253244
Sep. 28, 1989 [JP] Japan .................. 1-253245

[51] Int. Cl.$^6$ .............. H01L 23/48; H01L 29/44; H01L 29/52; H01L 29/60
[52] U.S. Cl. .................. 257/666; 257/669; 257/670; 257/674; 257/787
[58] Field of Search .............. 357/70, 72, 74, 81; 257/666, 669, 670, 674, 709, 787

[56] References Cited

U.S. PATENT DOCUMENTS

| | | | |
|---|---|---|---|
| 3,626,259 | 12/1971 | Torrance et al. | 357/71 |
| 4,677,526 | 6/1987 | Muehling | 257/787 |
| 4,858,073 | 8/1989 | Gregory | 357/81 |
| 4,931,854 | 6/1990 | Yonemasu et al. | 257/709 |
| 4,942,454 | 7/1990 | Mori et al. | 357/70 |
| 5,012,322 | 4/1991 | Guillotte et al. | 357/72 |
| 5,155,299 | 10/1992 | Mahulikar et al. | 257/709 |

Primary Examiner—Sara W. Crane
Assistant Examiner—Carl Whitehead, Jr.

[57] ABSTRACT

A leadframe according to this invention is formed by bonding a single leadframe with a substrate using adhesive film or double-sided adhesive resin film, which is divided and attached to two or more predetermined points between them. This reduces the quantity of gas or contaminants generated from adhesives. Also, this results in the reduction of the stress generated during heat treatment of the leadframe and also in the elimination of warping of the lead frame due to thermal stress. Cracking does not occur on the resin because resin is removed easily and assuredly, and no air is left behind. This contributes to high reliability and increased productivity. The lead frame is further formed by bonding a plurality of metal substrates of different materials to single leadframe. This through more stable thermal behavior high reliability.

17 Claims, 4 Drawing Sheets

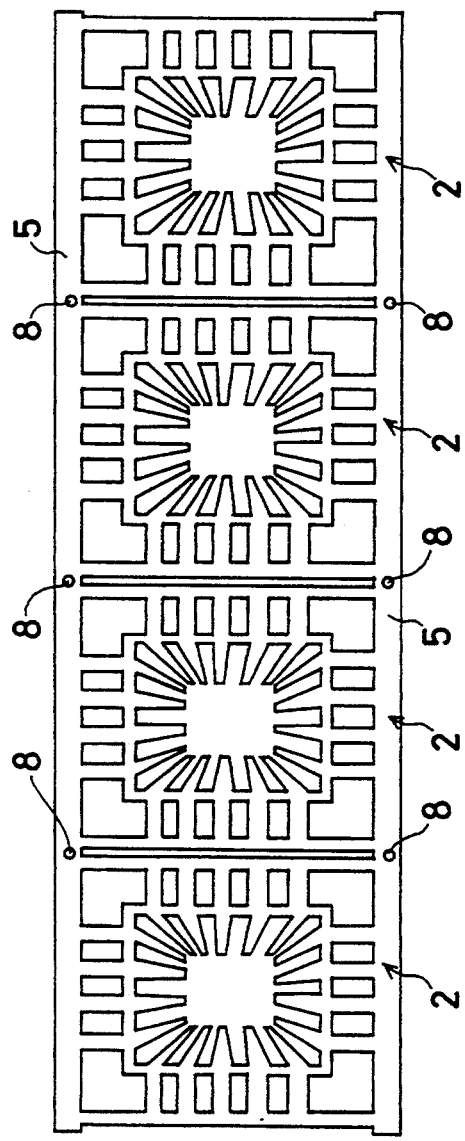
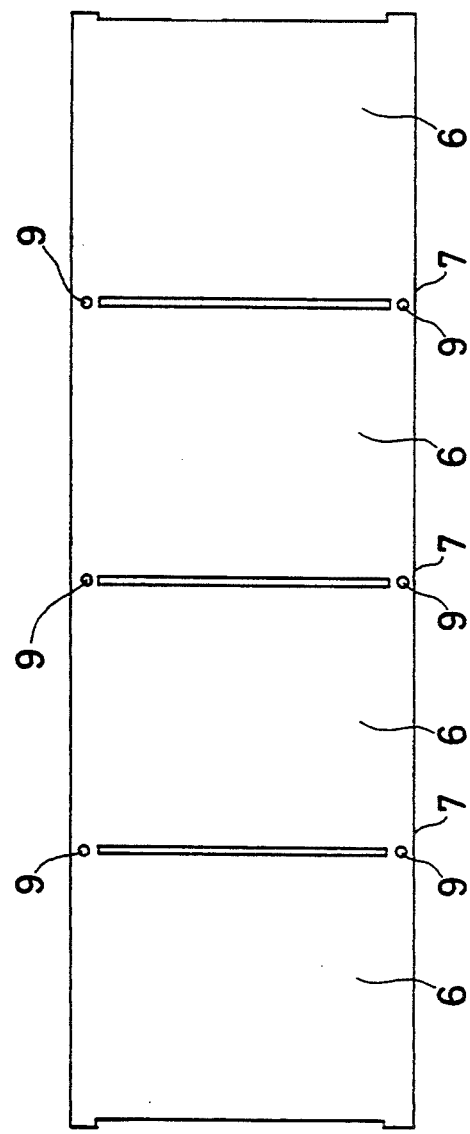

SEMICONDUCTOR DEVICE HAVING A LEADFRAME AND METAL SUBSTRATE

This application is a continuation of application Ser. No. 07/976,708 filed Nov. 16, 1992, now abandoned, which is a continuation of application Ser. No. 07/588,903, filed on Sep. 27, 1990, now abandoned.

BACKGROUND OF THE INVENTION

The present invention relates to a leadframe to be used for semiconductor assembly, and in particular to a leadframe of resin mold type to be used for high-speed and high heat-releasing type LSI, IC, etc.

As the method for chip packaging in semiconductor components such as LSI, IC, etc., a method to package the semiconductor chips on leadframe by resin mold or a method to package it by ceramics have been adopted in the past.

The resin mold package has high productivity of LSI and IC and it is produced at low cost and by mass production, while it is not suitable for highly heat-releasing type chips because heat-releasing property is low. Ceramic package can maintain the better characteristics of LSI and IC, while production cost is high and it is not suitable for mass production.

On the other hand, there are strong demands on small size and lightweight components in electronics industry. To cope with such demands, semiconductor package is now increasingly produced in smaller size and also with high pin count in the same size, and the manufacturing technique for such purpose has also been developed. To meet the demands for high pin count, it is necessary to shorten the distance between inner leads and to make inner lead finer and longer. However, when inner leads are made finer and longer, inner leads touch each other as they are bent during resin molding or when they are transported, and the reliability is deteriorated. For this reason, it has been customary in the past as shown in FIG. 8 to attach the tape 02 on many inner leads 01, and its strength is increased by attaching and fixing these inner leads 01. This requires, however, much labor for taping.

In this respect, a low priced resin mold package has been proposed in the Japanese Patent Publication No. 63-246851. This package is provided with the advantages of ceramic package and also maintains high-strength inner lead. This Publication discloses a multi-layer lead frame, in which the substrates consisting of polyimide film and metal plates are piled up and bonded on normal metal lead frame, and it is suitable for LSI with high heat-releasing property and high-speed type IC.

In the conventional type multi-layer leadframe, 4–10 leadframes are bonded together by continuous (serial form) side rail, and the substrates are produced independently from each other. Multi-layer leadframes are manufactured in such manner that, to each of the serial form lead frames, each substrate is bonded using adhesive or resin film having adhesives on both sides by aligning each substrate with the jig hole formed on the serial form side rail.

In the leadframe, as described in the above Patent Publication, leadframe is bonded on substrate or substrates are bonded with each other on the same plane, using double-sided adhesive tape, i.e. polyimide film coated with adhesive on both sides. This may result in the generation of gas from adhesive when it is hardened, or contaminants are increased and the reliability as package is deteriorated.

Also, resin tends to flow or withdraw poorly during molding resin sealing, and gaps are likely to occur. As the result, the air is left in the product, and productivity is deteriorated.

Further, because double-sided adhesive tape based on polyimide film is used, it is impossible to reduce the thickness of the package.

Because adhesive is coated on the entire surface of polyimide, stress is generated due to thermal expansion coefficient or thermal shrinkage of adhesive or polyimide film, and lead frame is warped or resin is cracked after packaging. The lead frame as described in the above Patent Publication or multi-layer leadframe now under development are produced by bonding a single metal material on leadframe. Because thermal behavior of adhesive, resin film having adhesive on both sides, leadframe material and metal substrate differ from each other, adhesive force is decreased during manufacturing process or leadframe may be warped.

Further, because each substrate is bonded with leadframe, it requires much labor, and also it is difficult to align lead frame with substrate. Thus, the productivity is not high.

In addition, the close fitness or sealing between metal substrate and mold resin are influenced by the stress or the shortage in resin quantity, and this results in the decline of reliability.

SUMMARY OF THE INVENTION

It is an object of the present invention to offer a leadframe capable with higher reliability and a method to manufacture such leadframe.

It is another object of this invention to offer a leadframe, which can be produced with higher productivity and with less thickness and a method to manufacture such leadframe.

It is still another object of the invention to offer a leadframe hardly influenced by heat and a method to manufacture such leadframe.

To attain the above objects, the leadframe of this invention comprises a leadframe consisting of a plurality of leads, and single-layer or multi-layer substrates consisting of metal or resin are bonded on said leadframe, characterized in that said leadframe and said substrates are bonded together by adhesive film or resin film having adhesive on both sides furnished at a plurality of the predetermined points between said leadframe and said substrates.

The method for manufacturing the leadframe according to this invention is characterized in that adhesive film or resin film having adhesive on both sides are divided and attached to a plurality of the predetermined points of said leadframe, and that said substrate is bonded with said adhesive film or said adhesive of said resin film.

Further, the method for manufacturing the leadframe of this invention comprises lead frame consisting of a plurality of leads, and single-layer or multi-layer substrate consisting of metal or resin are bonded to said leadframe characterized in that adhesive film or resin film having adhesive on both sides are divided and attached to a plurality of predetermined points on said substrate, and that said lead frame is bonded with said adhesive film or said adhesive of said resin film.

Further, the method for manufacturing the leadframe according to the invention is a method to manufacture a leadframe, which comprises leadframe consisting of a plurality of leads and single-layer or multi-layer substrate consisting of metal or resin, characterized in that said leadframe and said substrate are bonded by adhesive film or resin film having adhesive on both sides and being divided and furnished on a plurality of predetermined points between said leadframe and said substrate, and that said adhesive film or resin film having adhesive on both sides are simultaneously bonded with said leadframe and said substrate.

The method for manufacturing the leadframe according to this invention is a method to manufacture leadframe, which comprises leadframe consisting of a plurality of leads and single-layer or multi-layer substrate consisting of metal or resin is bonded on said leadframe, characterized in that both said single leadframe and said single substrate are formed by a plurality of the same serial chains, and that the single leadframe and the single substrate are joined together in chain-like serial form.

Further, the method for manufacturing leadframe according to this invention comprises single leadframe formed by a plurality of leads and single layer or multi-layer metal or resin bonded to said single leadframe, characterized in that said single leadframe and said single substrate are formed by a plurality of the same serial chains and that the single leadframe and the single substrate are bonded together by the methods such as adhesive film, resin film having adhesive on both sides, welding or caulking in chain-like serial form.

The method for manufacturing leadframe according to the invention is characterized in that said single leadframe and said single substrate are aligned by jig holes formed on common points of the chain-like serial form single leadframe and the single substrate.

Further, the method for manufacturing leadframe according to the invention is characterized in that said serial form single leadframe and said serial form single substrate are independently separated in the gap of said lead before the assembling process of chips to be mounted, during the chip assembling process or after resin molding.

Further, the leadframe according to this invention is a leadframe formed by a plurality of metal substrates bonded to the single leadframe having a plurality of leads, characterized in that said plurality of metal substrates are formed by different materials.

Further, the leadframe according to the invention is a leadframe comprising a plurality of metal substrates bonded to single leadframe having a plurality of leads, characterized in that said plurality of metal substrates have different thickness.

Further, the leadframe according to the invention is a leadframe comprising a plurality of substrates bonded to single leadframe having a plurality of leads, characterized in that different surface treatment is provided on said plurality of metal substrates.

Further, the leadframe according to the invention is a leadframe comprising a plurality of metal substrates bonded to single leadframe having a plurality of leads, characterized in that leadframe is formed by adequately combining said plurality of metal substrates of different material, different thickness and different surface treatment.

Further, the leadframe according to the invention is characterized in that said plurality of metal substrates bonded mutually or said single leadframe is bonded to said metal substrate by the insulating adhesive film or by resin film having double-sided adhesive.

In the leadframe of this invention produced by such arrangement, said adhesive film or said resin film is partially divided and provided between said single leadframe and said substrate, and this reduces the quantity of gas or contaminants generated from adhesive. Also, it is possible to reduce the stress, which is generated during heat treatment of leadframe and to eliminate the warping of leadframe due to thermal stress. Moreover, resin flows through the gap between the adjacent adhesive films or resin films during resin molding, and this eliminates the gaps because resin is withdrawn easily and assuredly. For this reason, the air is not left behind, and this eliminates the cracking of resin by the moisture remaining in such air.

Thus, the reliability as package is ameliorated, and the productivity is also extensively improved.

If adhesive film is used to bond single leadframe and inner lead together, the total thickness of multi-layer leadframe becomes thinner, and more compact package can be obtained.

Further, serial form single substrate is positioned and bonded to serial form single leadframe. This results in shorter time to bond leadframe with substrate and higher accuracy for positioning of leadframe and substrate. This further ensures high productivity.

Further, leadframe is formed by combining two or more metal substrates with different material, different thickness and different surface treatment according to the invention, more stable thermal behavior is provided. This also extensively enhances the reliability of leadframe.

In addition, a plurality of metal substrates are bonded by the insulating adhesive film or the resin film having adhesive on both sides according to this invention, and this contributes to the formation of high-speed and highly heat-releasing multi-layer leadframe.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIG. 4 and FIG. 5 are a plan view of the leadframe and substrate of another embodiment of this invention;

DESCRIPTION OF THE PREFERRED EMBODIMENTS

In the following, description is given on the embodiments of this invention in connection with the drawings.

Figure 1:
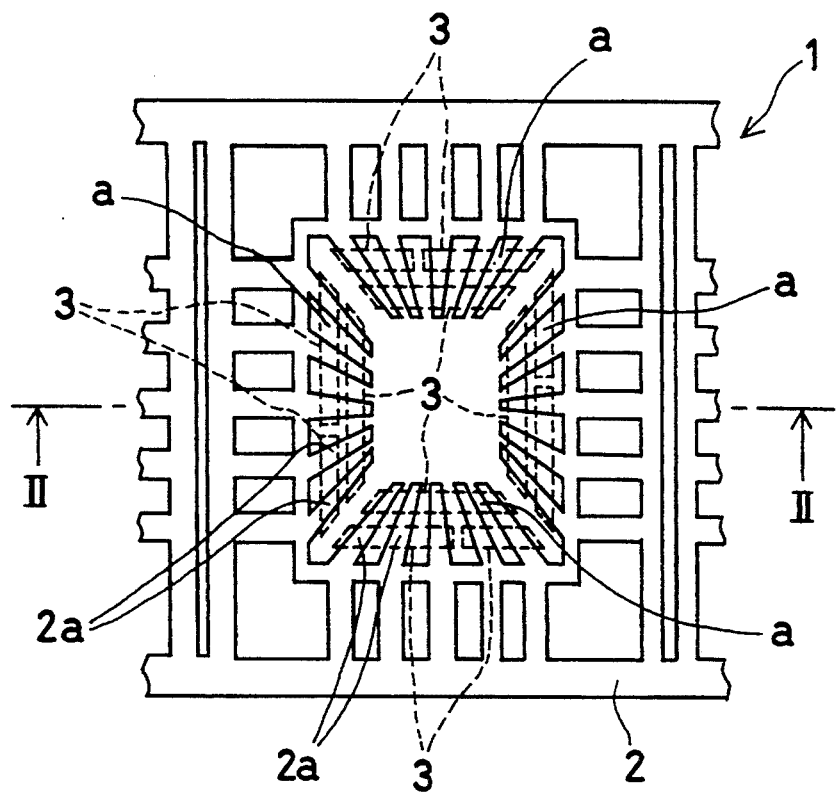
FIG. 1 is a plan view of an embodiment of a leadframe according to the present invention.
Figure 2:
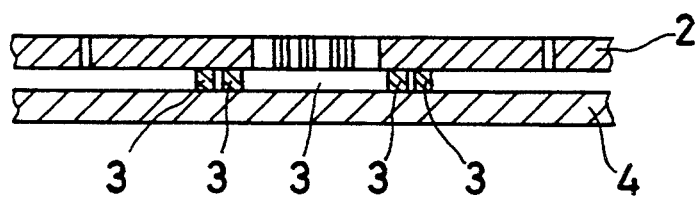
FIG. 2 is a sectional view along the line II—II in FIG. 1.

As shown in FIG. 1 and FIG. 2, leadframe 1 is formed in 3-layer structure, comprising a single leadframe 2 and a substrate 4 made of metal or resin and being bonded to said single leadframe 2 by adhesive film or resin film 3 having double-sided adhesive. The single leadframe 2 comprises a number of leads 2a, 2a, ..., and it is formed by etching or stamping similar to the conventional method. Also, similarly to the conventional type products, the single leadframe 2 is furnished with gold or silver plating at necessary points to facilitate wire bonding.

The adhesive film or the resin film having double-sided adhesive on both sides is divided and furnished at minimum number of points a, a, ..., on bottom surface of the bonding area on the single leadframe 2 in order to fix the substrate 4. Therefore, adhesive film or resin film is furnished with adequate spacing to each other. Adhesive film is, for example, thermosetting resin formed in film-like shape. Resin film has a base of polyimide film with thermosetting resin on both sides in form of double-sided tape.

Figure 3:
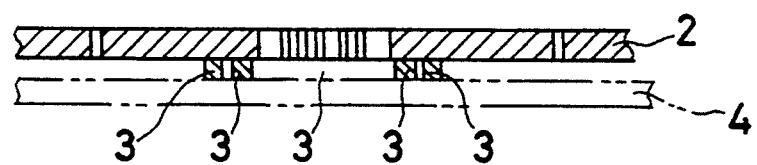
FIG. 3 is a drawing to explain the manufacture of the leadframe in this embodiment.

To obtain the leadframe 1 with the above arrangement, two or more adhesive films or resin films 3 are attached on said predetermined points of the single leadframe 2 by taping machine as shown in FIG. 3. On the bottom surface of the adhesive film or resin film 3 furnished on the bottom surface of single leadframe 2, substrate 4 is mounted by aligning the position with high accuracy, and this substrate 4 is bonded to single leadframe 2 by the method such as press-fitting or thermal press-fitting.

When the leadframe 1 thus obtained is sealed with mold resin, resin flows through the gap between the adjacent adhesive films or resin films, and this eliminates the gaps and facilitates easy and assured withdrawal of resin. As the result, the air is not left behind, and no cracking of resin occurs due to moisture remaining in such air.

Tables 1 to 4 show the results of the comparison between the leadframe 1 of this invention and the conventional type leadframe. In this case, Table 1 shows the results with the lead frame according to the invention, Table 2 the quantity of generated gas, Table 3 the number of voids generated after molding, and Table 4 the generated stress.

TABLE 1

|  | Leadframe | Attachment | Substrate |
| --- | --- | --- | --- |
| Embodiment 1 | 0.15 mmt; alloy 42 | 20 μm adhesive film; divided into 5 | Alloy 42 + Ag plating |
| Embodiment 2 | 0.15 mmt; alloy 42 | 20 μm adhesive film; divided into 8 | Glass epoxy substrate |
| Embodiment 3 | 0.15 mmt; copper | 20 μm adhesive on both sides 25 μm polyimide film; divided into 5 | Polyimide substrate; Copper + Ag plating |
| Embodiment 4 | 0.15 mmt; copper | 10 μm adhesive on both sides 50 μm polyimide film; divided into 8 | |

TABLE 2

| Quantity of the generated gas | |
| --- | --- |
| | Quantity generated |
| Prior art | 100 |
| Specimen 1 of this invention | 30 |
| Specimen 2 of this invention | 25 |

TABLE 3

| The number of voids after molding | |
| --- | --- |
| | Number of voids generated |
| Prior art | 6/9 |
| Specimen 1 of this invention | 0/5 |
| Specimen 2 of this invention | 0/5 |

TABLE 4

| | Stress | |
| --- | --- | --- |
| | Warping of leadframe | Ratio of cracking on package |
| Prior art | 0.35 mm | 100 |
| Specimen 1 of this invention | 0.12 mm | 35 |
| Specimen 2 of this invention | 0.13 mm | 30 |
| Specimen 3 of this invention | 0.21 mm | 50 |
| Specimen 4 of this invention | 0.26 mm | 50 |

As it is evident from Table 2-4, the quantity of generated gas, warping of the leadframe due to stress and the ratio of cracking are extensively reduced in the leadframe 1 of this invention.

FIG. 4 and FIG. 5 are to explain another embodiment of the method for manufacturing leadframe 1. The same number refers to the same component in the above embodiment, and the detailed description is not given here.

As shown in FIG. 4, four single leadframes 2, 2, ... are formed in serial formation connected by side rails 5, which serve as outer frame. Similarly, the substrates 6, 6, ... as many as the single leadframes 2 are formed by the serial side rails 7, 7, ..... On these serial side rails, jig holes 8, 8, ... and 9, 9, ... of the same size are furnished at the predetermined positions. The positions of these jig holes 8 and 9 are determined in relation to the center of the serial leadframe 2 and the center of the serial single substrates 6. In this case, the relation between of the positions of jig holes 9 and single substrates 6 corresponds to the relation of the positions of jig holes 8 and single leadframes 2. By inserting jig guide pins (not shown) into the jig holes 8 and 9, the positions of single leadframes 2 and single substrates 6 are automatically and accurately aligned during die attach in the assembling process or in resin molding.

To produce the leadframe with such arrangement, the serial single leadframe 2 is aligned with the serial single substrate 6 by inserting guide pins into jig holes 8 and 9, and these are bonded together by press-fitting or thermal press-fitting in serial formation using adhesive film or resin film having adhesive on both sides.

Then, single leadframe 2 and single substrate 6 are individually separated by machine at the gap of the lead 2a before assembling process of the chips to be mounted, during chip assembling process or after resin molding.

Tables 5 to 6 summarize the results of the comparison between the lead frames produced by the manufacturing method of this embodiment and those produced by the conventional manufacturing method. In this case, Table 5 shows the bonding time of substrate and lead frame, and Table 6 the position accuracy between substrate and leadframe.

TABLE 5

| Bonding time of substrate and leadframe | |
|---|---|
| | Bonding time of multi-layer leadframe |
| Conventional method | 50 sec./1 series (4 pieces) |
| Specimen of this invention | 10 sec./1 series (4 pieces) |

TABLE 6

| Position accuracy of substrate and leadframe | |
|---|---|
| | Position accuracy |
| Conventional method | ±0.120 μm |
| Specimen of this invention | ±0.055 μm |

As it is evident from Table 5 and Table 6, it is possible by the manufacturing method of leadframe of this embodiment to extensively shorten the bonding time of substrate and leadframe and to align the position of substrates and leadframes at high accuracy. This results in extensive improvement of the productivity of leadframes.

Figure 6:
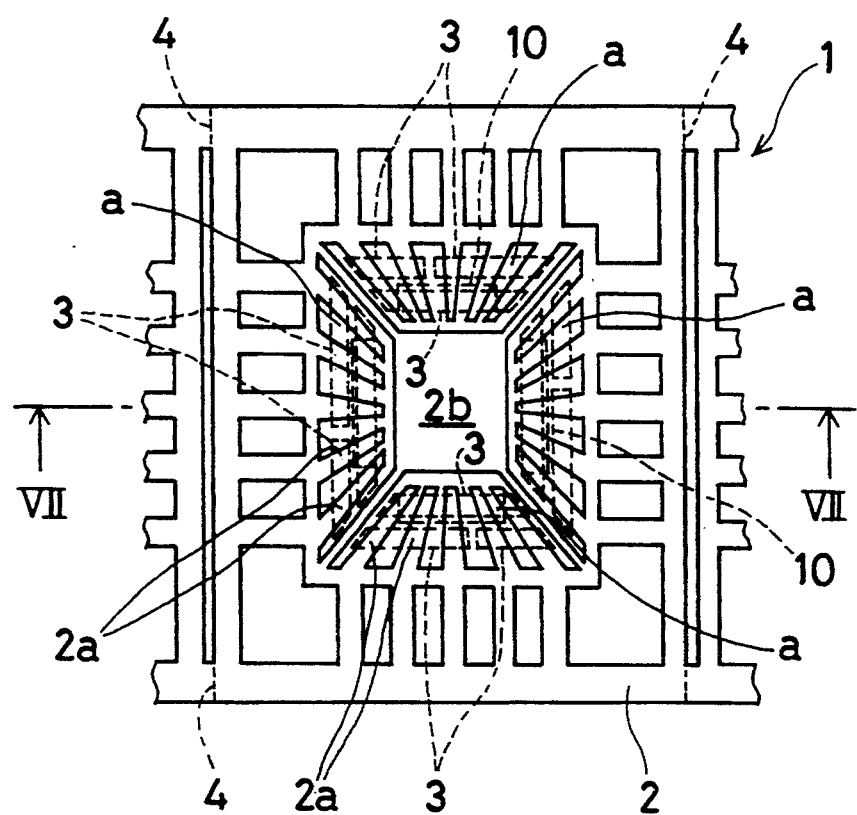
FIG. 6 is a plan view of still another embodiment of the invention.
Figure 7:
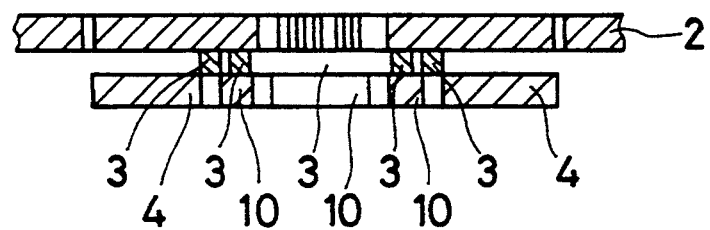
FIG. 7 is a sectional view along the line VII—VII of FIG. 6.
Figure 8:
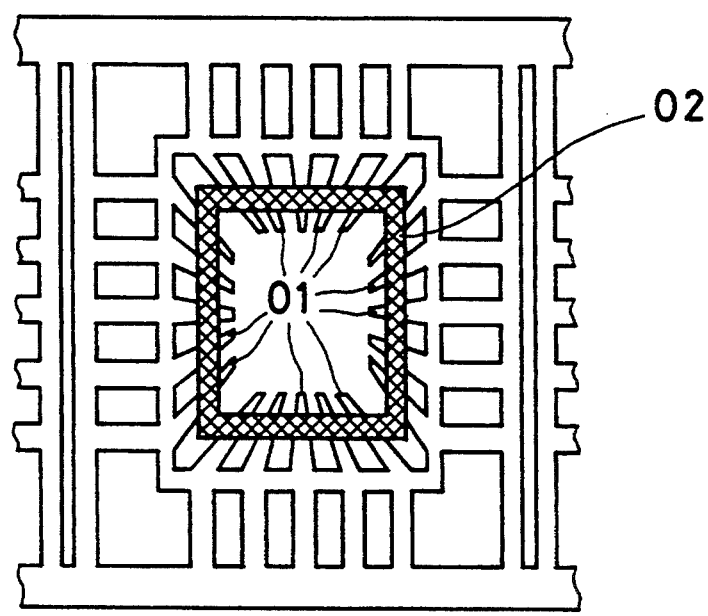
FIG. 8 is a plan view of a conventional type leadframe.

FIG. 6 and FIG. 7 are to explain another embodiment of the leadframe of this invention. The same number refers to the same component in the above embodiment, and detailed description is not given here.

As shown in FIG. 6 and FIG. 7, the leadframe 1 of this embodiment is formed in multi-layer structure, comprising two or more metal substrates 4 and 10 bonded to single leadframe 2 by adhesive film or resin film 3 having adhesive on both sides.

The metal substrate 4 is made of alloy 42 in the form of a ring and is bonded to outer periphery of the leadframe 1. The metal substrate 10 is made of copper material having excellent thermal conductivity and is bonded near the die pad 2b. Through such arrangement, the metal substrate 4 plays a role to protect the leadframe 1, and the metal substrate 10 efficiently disperses the heat from chip (not shown), which is assembled on the die pad 2b. This reduces the deformation or warping of the leadframe 1.

In the leadframe 1 of another embodiment, metal substrate 4 and 10 are made of copper material. In this case, the metal substrate 10 bonded to bottom surface of the die pad 2b of single leadframe has thickness of 1 mm, and this facilitates the release of heat. Further, the metal substrate 4 bonded to the lead unit near outer periphery of the leadframe 1 has the thickness of 0.15 mm, and this metal substrate 4 is furnished for the application as electrode. Resin seal is performed by aligning the bottom surface of metal substrate 10 for heat dispersion with the bottom surface of mold resin, and this contributes to the manufacture of the package with excellent heat releasing property.

In still another embodiment of the invention, metal substrate 10 is bonded to the center of a leadframe without die pad and formed from alloy 42. This metal substrate 10 is made of alloy 42 with copper plating of about 5 μm, and it is used for electrode. Metal substrate 4 is bonded to the periphery of the leadframe 1, and this metal substrate 4 is made of alloy 42 processed by palladium plating, gold plating or tin-nickel alloy plating to provide high adhesive property to resin. This contribute to the formation of a package with high reliability and strong resistance to the intrusion of moisture.

Further, in any of the above embodiments, high-speed and highly heat-releasing IC or LSI can be produced by using insulating adhesive film or resin film having adhesive on both sides for the bonding between metal substrates 4 and 10 or for the bonding between metal substrate 4 and 10 and single leadframe 2.

The present invention is not limited to the above embodiments, and various design modifications are conceivable.

For example, leadframe 1 is formed in 3-layer structure in the above embodiments, whereas it may be formed in multi-layer structure by furnishing adhesive film or resin film on the lower surface of metal substrate 4 or 10 and by bonding another metal substrate.

In the above embodiments, adhesive film or resin film 3 having adhesive on both sides are attached first on the single leadframe 2, whereas the adhesive film or the resin film 3 having adhesive on both sides may be attached first on the substrate or single leadframe 2, and adhesive film or resin film 3 having adhesive on both sides and the substrate 4 can be bonded together at the same time.

Further, the serial single leadframe and serial single substrate can be bonded together in serial form by welding or caulking.

Further, in the above embodiments, adhesive film or double-sided adhesive resin film 3 is divided into two or more points, whereas adhesive film or double-sided adhesive resin film 3 may be continuously furnished on metal substrates 4 and 10 and on single leadframe 2.

Further, it is possible to form lead frame by adequately combining two or more metal substrates of different materials, different thickness and different surface treatment.

It is also possible to bond single leadframe and two or more single substrates by welding or caulking.

What we claim is:

1. A leadframe for a package sealed by resin, comprising:
   a first and a second side rails extending in a first direction and arranged face-to-face to each other;
   a plurality of leads each having first and second end portions, with said first end portions extending away from said side rail in a second direction which is substantially perpendicular to said first direction, and said second portions are connected to said side rail;
   said leads being composed of:
   a first lead group extending from said first side rail toward said second side rail, and
   a second lead group extending from said second side rail toward said first side rail;
   a metal substrate bonded together with said plurality of leads;
   two electrically non-conductive adhesive films in approximately rectangular shape and having adhesive properties on each of the sides to adhere said substrate and said plurality of leads, being composed of:
   a first film adhering to said first lead group, and
   a second film adhering to said second lead group;
   whereby each of said first and said second films extends in a said first direction, being divided in said direction, and bonded with a spacing between divided and opposed portions.

2. A leadframe according to claim 1, wherein the spacing between said opposed portions is positioned in a space formed between said leads, which are adjacent to each other.

3. A leadframe according to claim 1, wherein a portion of a die pad is arranged adjacent to a second portion of said lead.

4. A leadframe for a package sealed by resin, comprising:
first and second side rails disposed to opposed each other, extending in a first direction;
first and second connecting means for connecting said side rails and extending in a second direction which is substantially perpendicular to said first direction, forming a frame portion;
a plurality of leads each having first and second end portions, said second end portions being connected to said frame portion and to said side rail portion;
said leads having:
a first group extending toward said second side rail from said first side rail,
a second group extending toward said second connecting means from said first connecting means,
a third group extending toward said first side rail from said second rail, and
a fourth group extending toward said first connecting means from said second connecting means;
a metal substrate bonded together with said plurality of leads; and
four electrically non-conductive adhesive films in approximately rectangular shape, adhering to said metal substrate and having adhesive properties to adhere said plurality of leads and said metal substrate to the side, comprising:
a first film adhering to said first group of leads,
a second film adhering to said second lead group,
a third film adhering to said third lead group, and
a fourth film adhering to said fourth lead group;
said first and said third films extending in said first direction, and said second and said fourth films extending in said second direction; and
each of said first to said fourth electrically non-conductive adhesive films being arranged with spacings between said end portions so that the end portions in longitudinal direction of said film do not contact each other; and
each of said first and said third electrically non-conductive adhesive films being divided in said second direction, and each of said second and said fourth electrically non-conductive adhesive films being divided in said first direction to adhere with spacings between the divided and opposed portions.

5. A leadframe according to claim 4, wherein the spacings between said end portions and the spacings between said opposed portions are positioned in a space formed between said leads, which are adjacent to each other.

6. A leadframe according to claim 4, wherein a further electrically non-conductive adhesive film in approximately rectangular shape and having adhesive properties on each of the sides to adhere said plurality of leads and said metal substrate is positioned inside each of said divided four electrically non-conductive adhesive films and positioned separately from and in parallel to each of said four electrically non-conductive adhesive films, and bonding said substrate to said lead group with spacings between said end portions so that the end portions in longitudinal direction do not contact each other.

7. A leadframe according to claim 6, wherein the spacings between said end portions are positioned in a space formed between said leads, which are adjacent to each other.

8. A leadframe according to claim 4, wherein a portion of a die pad is arranged adjacent to a second end portion of said lead.

9. A resin molded semiconductor device having a chip, a plurality of leads, a metal substrate, and a molded resin encapsulating said chip, said plurality of leads and said substrate,
wherein said plurality of leads and said metal substrate are bonded by electrically non-conductive adhesive film in approximately rectangular shape and having adhesive properties on the sides to adhere said plurality of leads and said metal substrate, each lead having an end portion extending in a first direction toward said chip; and
said electrically non-conductive adhesive film comprises a first film and a second film extending in parallel to each other and positioned with said chip therebetween in a second direction, which is substantially perpendicular to said first direction, and each of said first and said second electrically non-conductive adhesive films being divided in said first direction and bonded together with spacings between the divided and opposed portions.

10. A semiconductor device according to claim 9, wherein the spacings between said opposed positions are positioned in a space formed by said leads, which are adjacent to each other.

11. A resin molded semiconductor device according to claim 9, wherein a portion of a die pad is arranged adjacent to a second portion of said lead.

12. A substantially square-shaped resin molded semiconductor device-having a substantially square-shaped chip, a plurality of leads, a metal substrate, and a molded resin, said chip, said plurality of leads and said substrate being encapsulated together with a first end portion of said leads, which are protruding from four sides of said molded resin;
said plurality of leads and said metal substrate being bonded by plural electrically non-conductive adhesive films in approximately rectangular shape and having adhesive properties on the side to adhere these components, each lead having a second end portion extending toward four sides of said chip, each of said electrically non-conductive adhesive films being arranged substantially in parallel on said four sides of said chip, and spacings are provided between said end portions of said films so that the end portions in longitudinal direction of the said film do not contact each other, and each of said electrically nonconductive films being divided in a direction perpendicular to longitudinal direction of said film and being bonded with spacings between the divided and opposed portions.

13. A semiconductor device according to claim 12, wherein the spacings between said end portions and the spacings between said opposed portions are positioned in a space formed between said leads, which are adjacent to each other.

14. A resin molded semiconductor device according to claim 12, wherein further electrically non-conductive films in approximately rectangular shape and having adhesive properties on the side to adhere said plurality of leads and said metal substrate are arranged inside each of said divided electrically non-conductive adhesive films, being positioned separately from and in parallel to said divided electrically non-conductive adhesive film, and said metal substrate is bonded to said leads with spacings between said end portions of said films so that the end portions in longitudinal direction do not contact each other.

15. A semiconductor device according to claim 14, the spacings between said end portions are positioned in a space formed between said leads, which are adjacent to each other.

16. A resin molded semiconductor device according to claim 12, wherein a portion of a die pad is arranged adjacent to a second end portion of said lead.

17. A leadframe according to claim 6, wherein said metal substrate is bonded to one of said plurality of leads at two points.

* * * * *